(12) United States Patent
Blanton et al.

(10) Patent No.: US 11,378,593 B2
(45) Date of Patent: Jul. 5, 2022

(54) VOLTAGE INDICATOR DISPLAY MODULE WITH REMOVABLE BATTERY SHUTTLE

(71) Applicant: Panduit Corp., Tinley Park, IL (US)

(72) Inventors: Derek W. Blanton, Cumming, GA (US); Michael Scott Adams, Cumming, GA (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 16/330,644

(22) PCT Filed: Sep. 18, 2017

(86) PCT No.: PCT/US2017/051977
§ 371 (c)(1),
(2) Date: Mar. 5, 2019

(87) PCT Pub. No.: WO2018/053386
PCT Pub. Date: Mar. 22, 2018

(65) Prior Publication Data
US 2021/0285986 A1    Sep. 16, 2021

Related U.S. Application Data

(60) Provisional application No. 62/396,467, filed on Sep. 19, 2016.

(51) Int. Cl.
*G01R 13/40*  (2006.01)
*G01R 19/155* (2006.01)
*H01M 10/48*  (2006.01)

(52) U.S. Cl.
CPC .......... *G01R 13/40* (2013.01); *G01R 19/155* (2013.01); *H01M 10/488* (2013.01)

(58) Field of Classification Search
None
See application file for complete search history.

(56) References Cited

U.S. PATENT DOCUMENTS 3,141,128 A    7/1964   Behr
4,870,343 A    9/1989   Dooley et al.
(Continued)

FOREIGN PATENT DOCUMENTS

CN    101171728      4/2008
JP    H05-290821 A  11/1993
(Continued)

OTHER PUBLICATIONS

"Absence of Voltage Tester Pre-Release Product Bulletin" Panduit Corp. (Year: 2016).*
(Continued)

*Primary Examiner* — Douglas X Rodriguez
(74) *Attorney, Agent, or Firm* — Christopher S. Clancy; James H. Williams; Christopher K. Marlow (57) ABSTRACT

A voltage display module for a voltage indication device has a well body, communication cable, cap, and battery shuttle. The well body is secured to the door of the electrical enclosure. The communication plug of the communication cable is secured to the well body. The cap is removably secured to the well body and is accessible to a user from outside the enclosure. The battery shuttle is housed within the well body and has a communication jack secured to one end. The communication jack is configured to engage the communication plug when the battery shuttle is fully inserted and configured to be electrically isolated from the plug when the battery shuttle is partially withdrawn.

7 Claims, 13 Drawing Sheets

(56) References Cited

U.S. PATENT DOCUMENTS

| | | | |
|---|---|---|---|
| 5,814,997 A | 9/1998 | Bouchez | |
| 5,867,019 A | 2/1999 | Malenko et al. | |
| 5,986,557 A | 11/1999 | Clarke | |
| 6,703,938 B1 | 3/2004 | Clarke | |
| 7,319,315 B2 | 1/2008 | Martin | |
| 7,610,783 B2 * | 11/2009 | Rudduck | F16B 21/186 70/277 |
| 8,013,613 B2 | 9/2011 | Allen, Jr. | |
| 9,644,828 B1 * | 5/2017 | May | F21S 4/28 |
| 2011/0070756 A1 | 3/2011 | Peckham | |

FOREIGN PATENT DOCUMENTS

| | | | |
|---|---|---|---|
| JP | 2009-010706 | 1/2009 | |
| WO | WO-2015095216 A1 * | 6/2015 | G01R 19/155 |
| WO | 2016036952 A1 | 3/2016 | |

OTHER PUBLICATIONS

VeriSafe™ Absence of Voltage Tester Pre-Release Product Bulletin; Panduit® Corp., Sep. 8, 2016; http://www.panduit.com/ccurl/399/131/abense-of-voltage-detector-sfcb06,0.pdf; retrieved on Mar. 5, 2019; 8 pgs.

VeriSafe™ Absence of Voltage Tester Presentation; Panduit® Corp., Mar. 2016; https://www.panduit.com/content/dam/panduit/en/landing-pages/verisafe/VeriSafe-External-Overview.pdf; retrieved on Mar. 5, 2019; 15 pgs.

\* cited by examiner

VOLTAGE INDICATOR DISPLAY MODULE WITH REMOVABLE BATTERY SHUTTLE

CROSS REFERENCE TO RELATED APPLICATIONS

This application claims priority to U.S. Provisional Application No. 62/396,467, filed Sep. 19, 2016, the subject matter of which is hereby incorporated by reference in its entirety.

FIELD OF THE INVENTION

This application is generally related to voltage indicators and specifically to display modules for voltage indicators that allow for access to electronics without exposing a user to high voltages.

BACKGROUND OF THE INVENTION

Voltage indicators that provide a positive indication of a lack of voltage typically need a power source other than the power source that is being monitored by the voltage indicator. One method of providing this source of power is through a battery. However, occasionally that battery will need to be replaced and it would be desirable to be able to replace the battery without removing power from the source being monitored and without exposing a user to high voltages while replacing the battery.

SUMMARY OF THE INVENTION

A voltage display module for a voltage indication device has a well body, communication cable, cap, and battery shuttle. The well body is secured to the door of the electrical enclosure. The communication plug of the communication cable is secured to the well body. The cap is removably secured to the well body and is accessible to a user from outside the enclosure. The battery shuttle is housed within the well body and has a communication jack secured to one end. The communication jack is configured to engage the communication plug when the battery shuttle is fully inserted and configured to be electrically isolated from the plug when the battery shuttle is partially withdrawn.

DETAILED DESCRIPTION OF THE PREFERRED EMBODIMENTS

Figure 1:
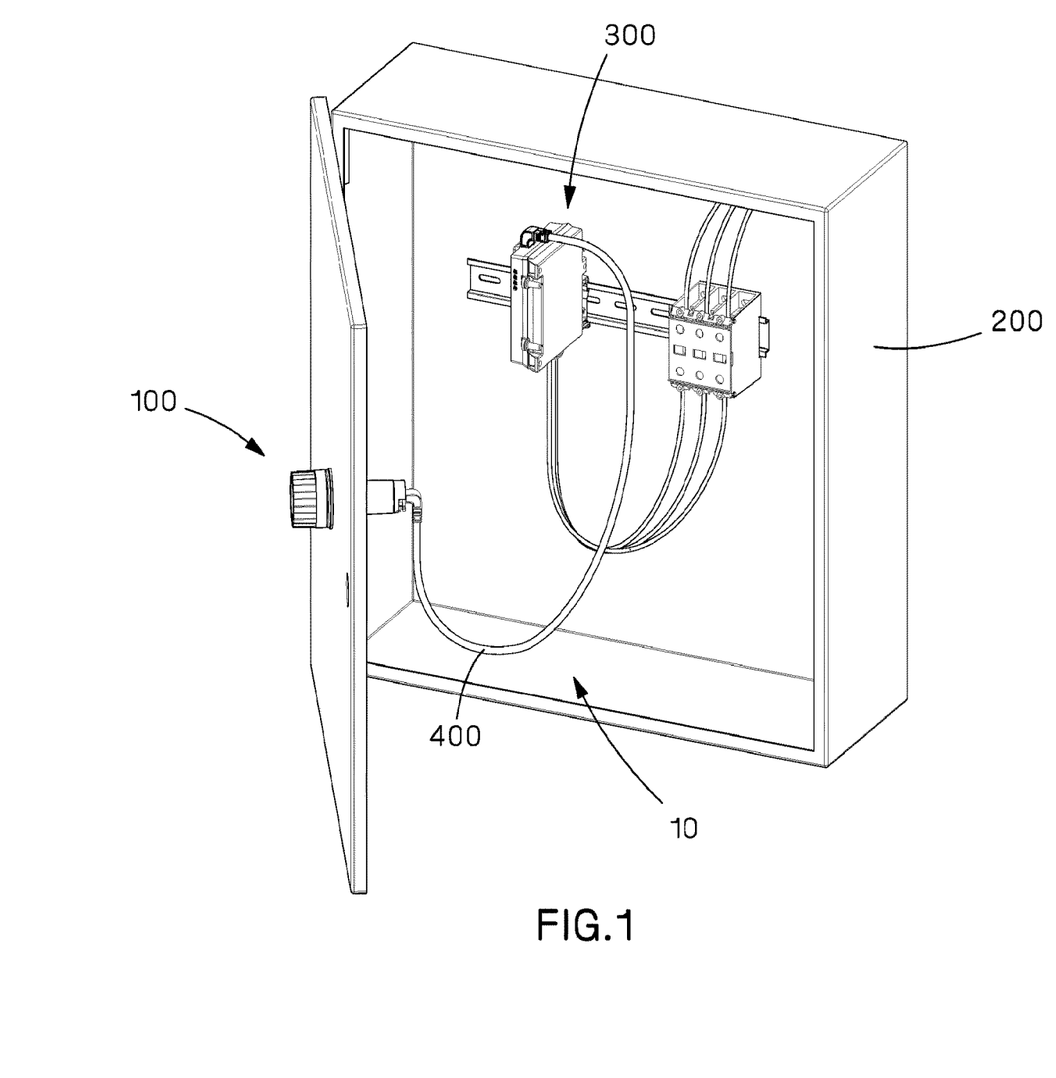
FIG. 1 shows an isometric view of a voltage detection device with a display module and a DIN module installed within an electrical enclosure.

This disclosure describes the display module 100 design for a voltage indication device 10. As shown in FIG. 1, the voltage indication device 10 product consists of two separate enclosures that house the electronics used to perform the voltage absence verification.

The DIN module 300 is an enclosure that houses one or more circuit assemblies. These circuit assemblies provide the voltage measurement and system check functions. The DIN module 300 is designed to be mounted on DIN rail or surface mounted inside of the electrical enclosure 200 to keep hazardous voltage away from the door.

The display module 100 will be mounted on the door 210 of the enclosure 200 and will provide means to initiate the test sequence and visually see indication of the results. In addition, the display module 100 will contain the battery that is needed to support the test functions and a circuit assembly needed to facilitate the test initiating and results reporting functions. The design will provide means to change the battery from the enclosure door without entering the electrical enclosure or giving exposure to the potentially hazardous levels of electrical energy being monitored by the product.

Figure 2:
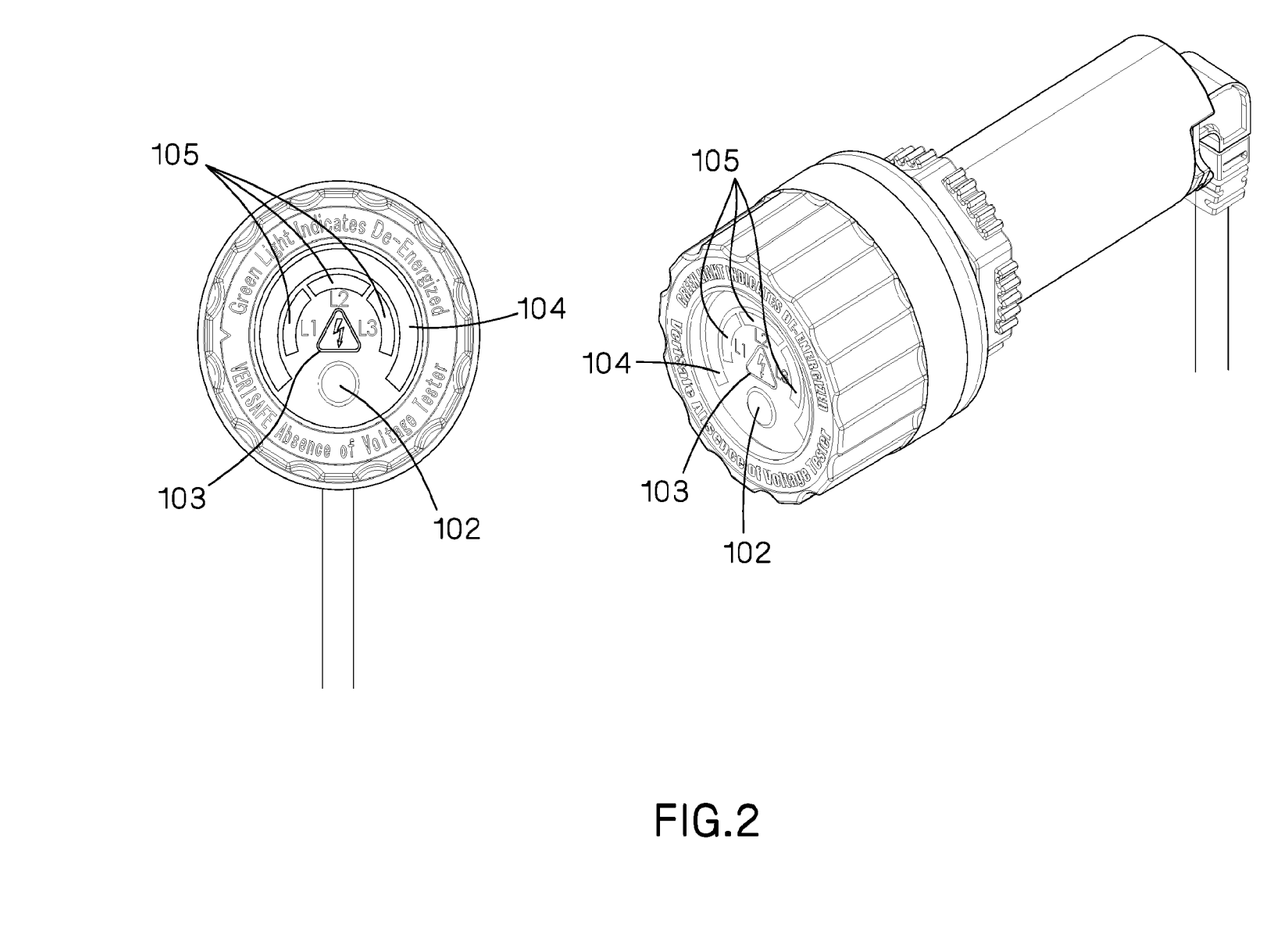
FIG. 2 is, a front view and an isometric view of the display module of FIG. 1.

FIG. 2 shows a front view and an isometric view of the display module 100. In FIG. 2, a test button 102 is pressed by the user to initiate the verification tests. A test status indicator 103 is illuminated by a yellow LED to indicate that a test is in progress and/or test failure. A green LED 104 will illuminate green to indicate that the test has verified the absence of voltage below a defined threshold as well as proper connection and function of the device. Red LEDs 105 will illuminate to show presence of voltage over a certain threshold on each of the lines in a 3 phase system.

Figure 3:
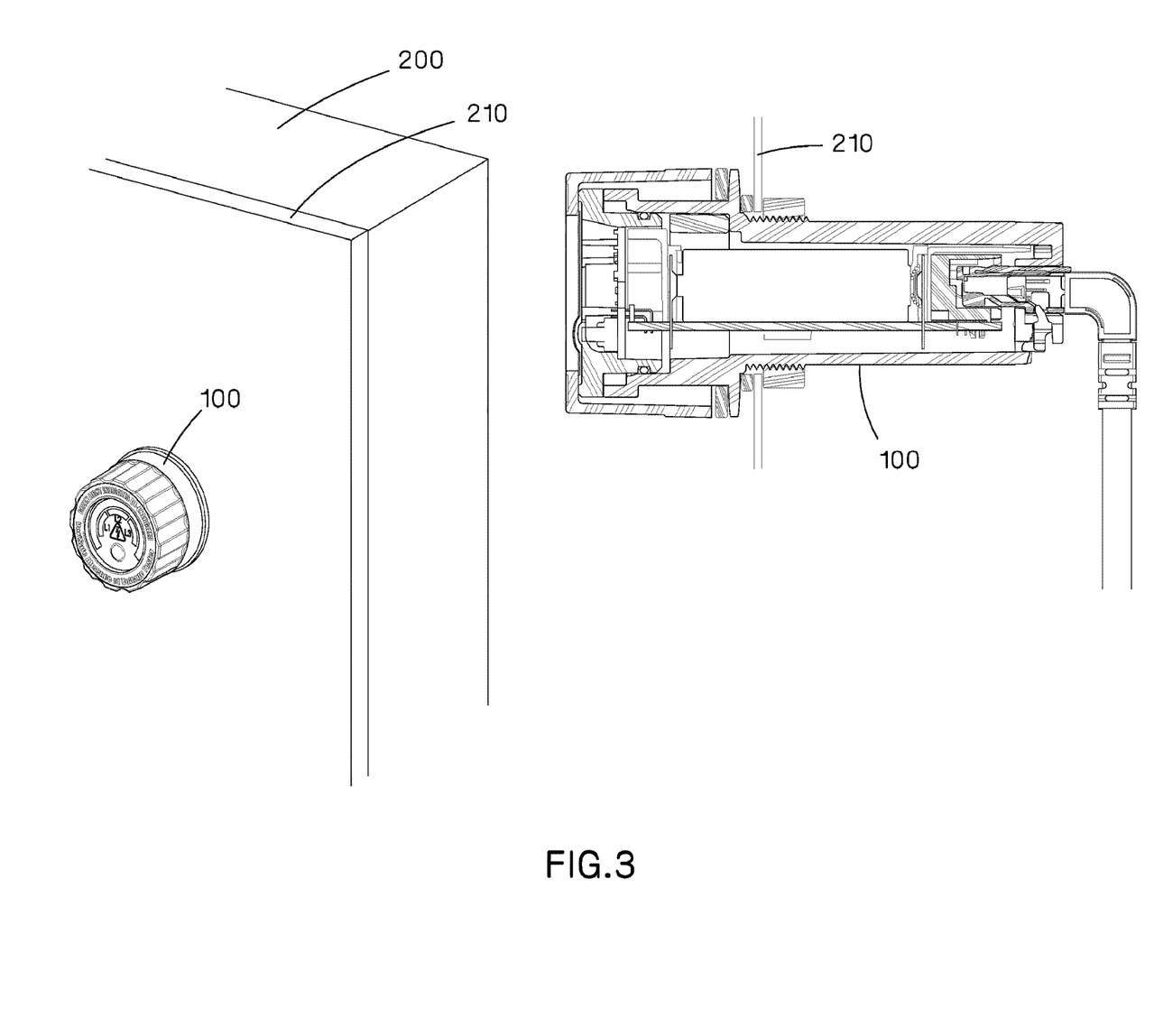
FIG. 3 is a perspective view and a cross-sectional view of the display module of FIG. 2 installed on a door panel of an electrical enclosure.

FIG. 3 shows the display module 100 installed in a control panel or electrical enclosure 200. Note that some of the display module 100 will be accessible outside of the electrical enclosure 200 and some will be inside the electrical enclosure 200.

Figure 4:
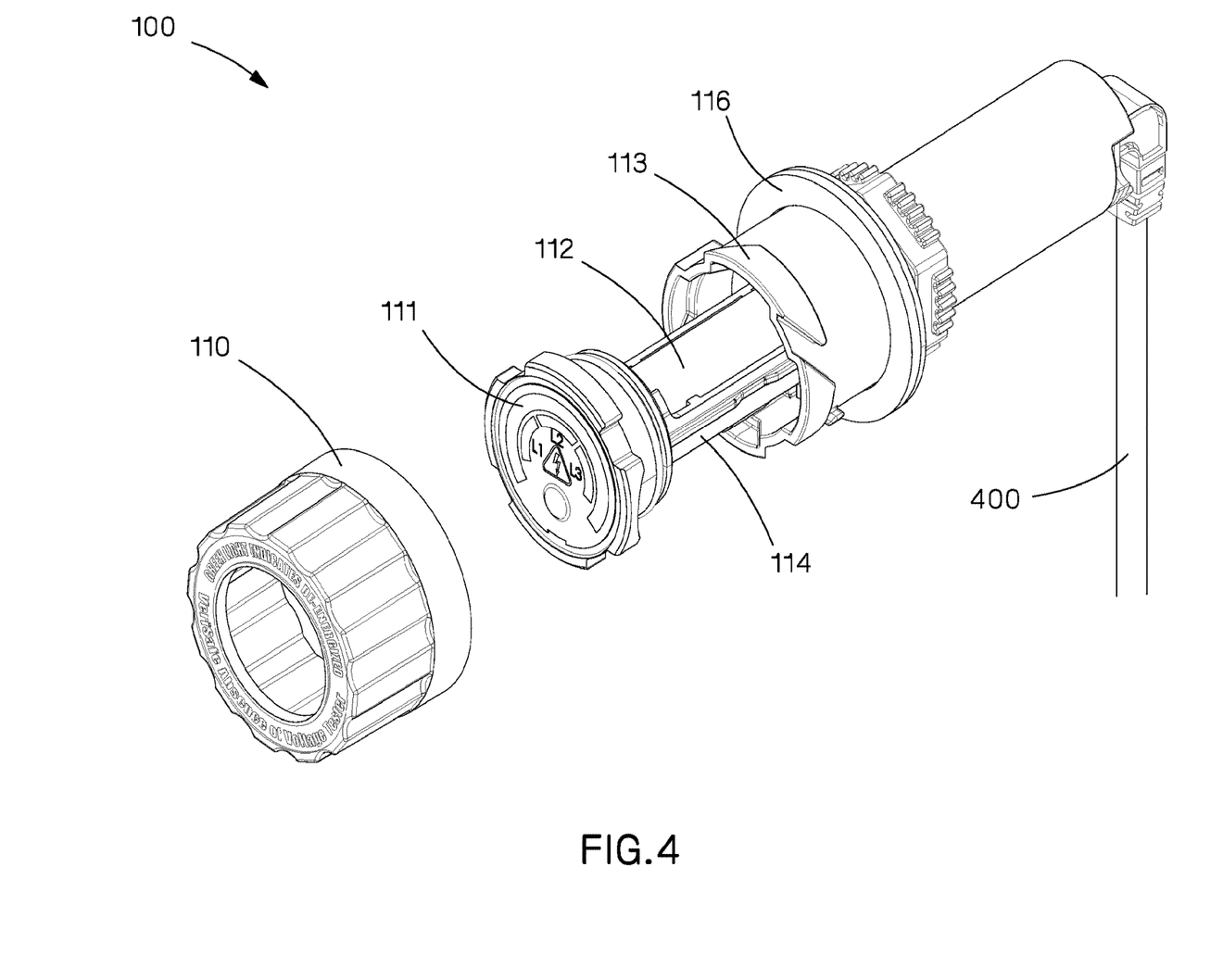
FIG. 4 is a partially exploded isometric view of the display module of FIG. 2.
Figure 8:
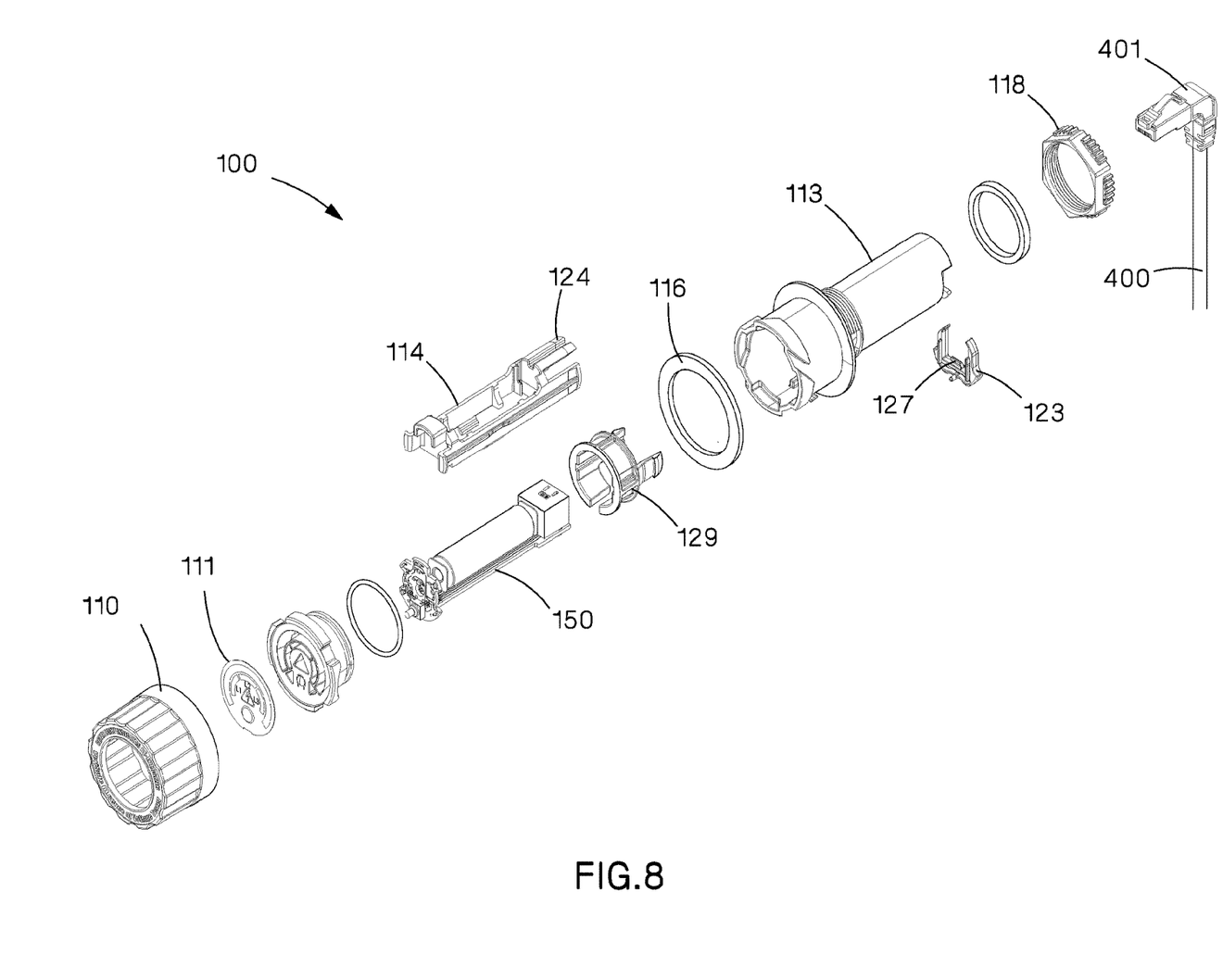
FIG. 8 is an exploded isometric view of the display module of FIG. 8.

FIG. 4 is an exploded view of the display module 100. In one embodiment, the display module 100 includes a cap 110, faceplate 111, battery 112, well body 113, compression washer 116, and battery shuttle 114. The cap 110 is used to retain and position the battery shuttle 114 and faceplate 111. The battery shuttle 114 is housed in the well body 113 and slides out to give the user access to the battery, which will require replacement at the end of its life. The battery shuttle 114 can also house the circuit assemblies (see FIG. 8) and faceplate 111. The compression washer 116 functions with the cap 110 and provides a spring-type resistance when installing. The well body 113 houses the battery shuttle 114, RJ45 plug retention features and features used to mount the display module to the electrical enclosure door panel 210. The well body 113 is designed to be installed in a standard 30 mm knockout, typical in electrical enclosures. The faceplate 111 can house the LED lights, push button and graphics overlay.

Figure 5:
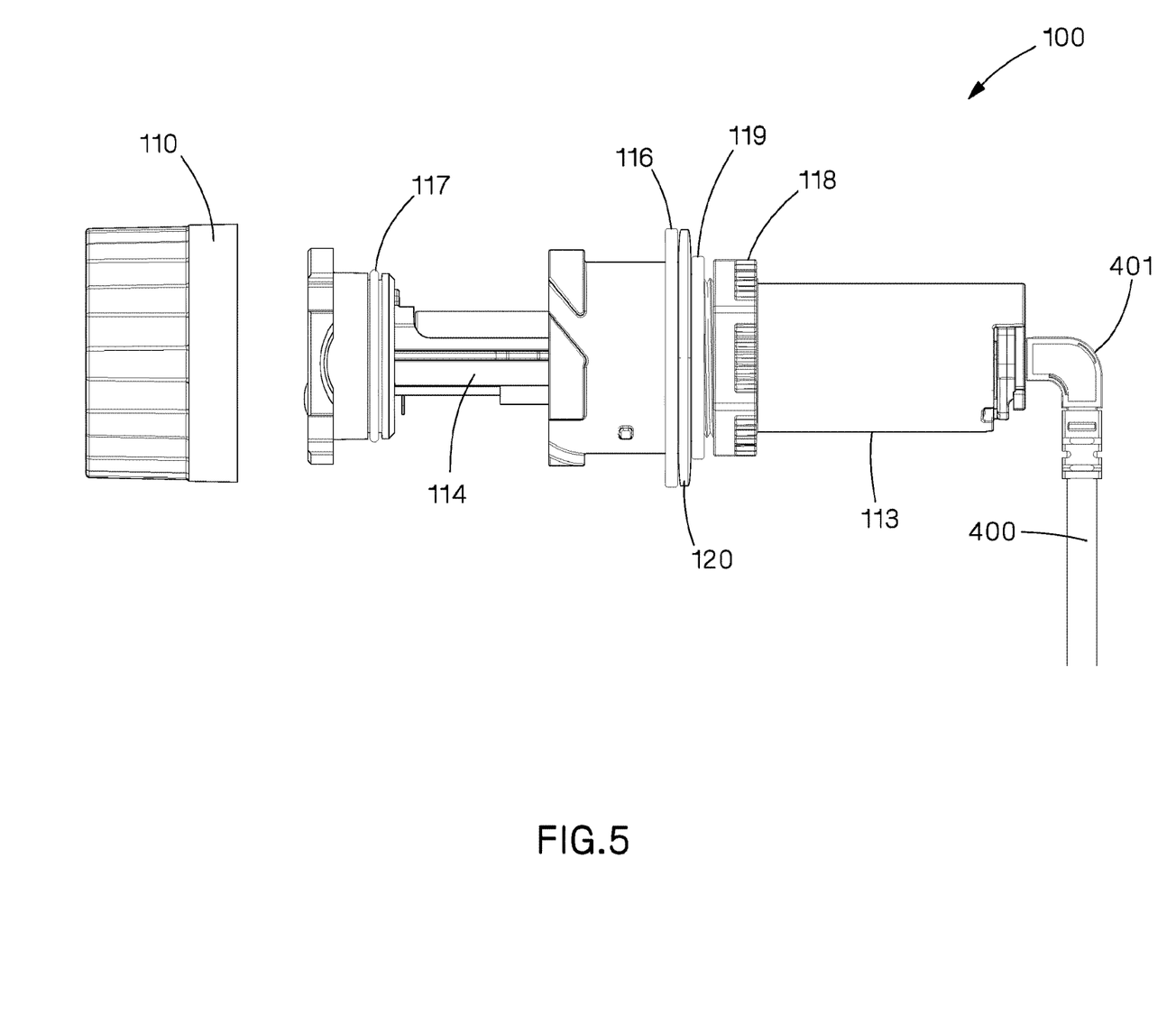
FIG. 5 is a side view of the display module of FIG. 2.

As shown in FIG. 5, a battery shuttle o-ring 117 is used to seal the battery shuttle 114 to the well body 113. This will prevent water ingress to the well body 113 that contains the battery 112 and electronics. A mounting nut 118 can be used to fasten the well body housing 113 to the electrical enclosure panel 200. A sealing gasket 119 can be used to seal the well body 113 to the electrical enclosure door panel 210; this can help to prevent water ingress to the electrical enclosure 200. A well body flange 120 can be used to back up both the sealing gasket 119 and the compression washer 116. FIG. 5 also shows a network cable 400, which can be a 600V CAT5E cable, that can be used to transmit low-voltage signals from the DIN module 300 to the display module 100. These signals can include the button press to initiate the test and signals to light the various LED indicators. The network cable 400 can also conduct power from the battery 112 (in the display module 100) to the DIN module 300 to be used for the various tests performed by the circuits in the DIN module in order to verify proper function, connection and absence of voltage.

Figure 6:
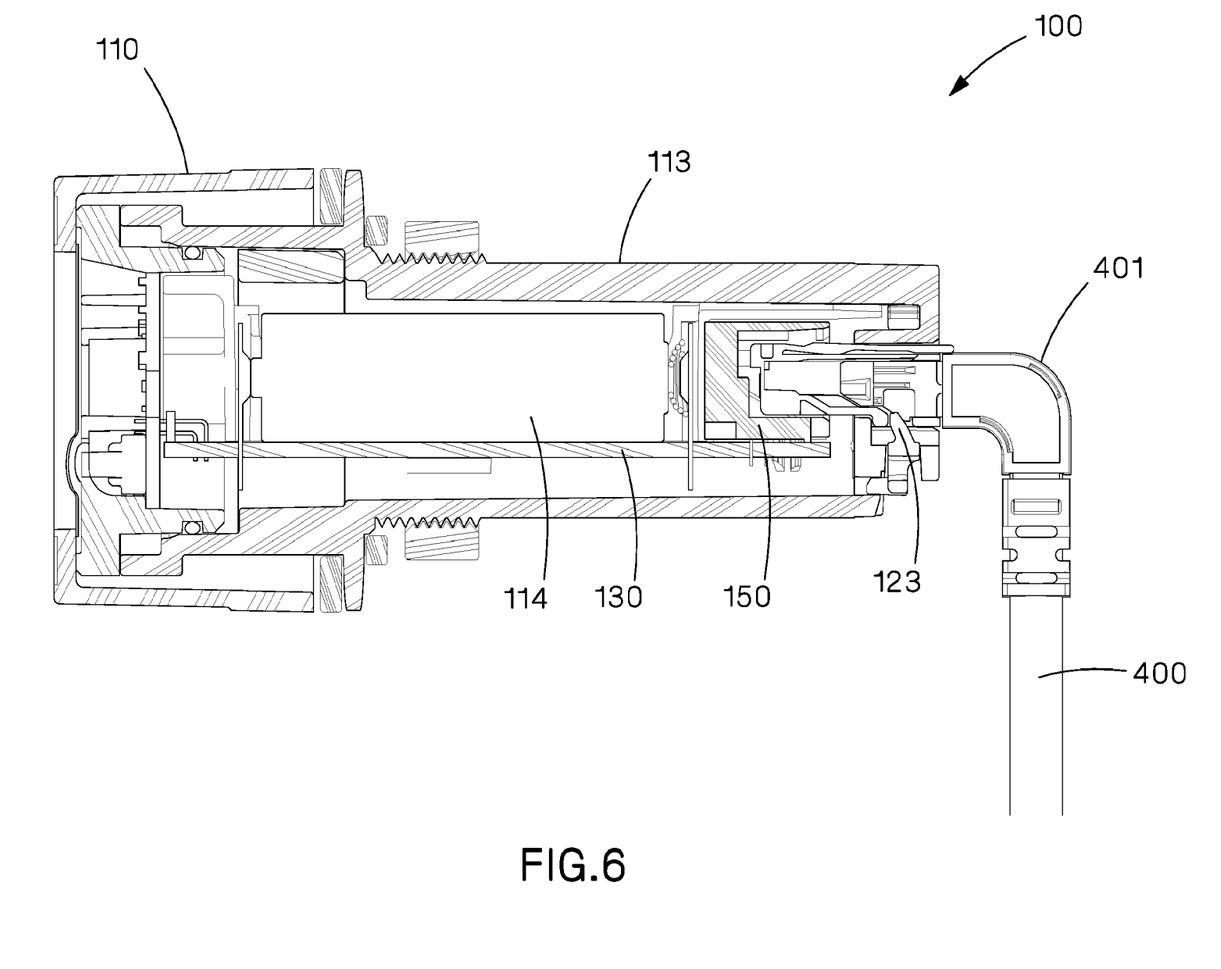
FIG. 6 is a cross-sectional view of the display module of FIG. 2.

As shown in the cross-sectional view of FIG. 6, the connection between the display module 100 and the network cable 400 is facilitated by an RJ45 jack and RJ45 plug assembly. In this case, an RJ45 jack assembly 150 is permanently mounted on a display module circuit assembly 130 housed on the battery shuttle 114. This circuit assembly 130, along with the RJ45 jack assembly 150 is permanently fixed to the battery shuttle 114. The RJ45 plug 401 can have a 90-degree strain relief that routes the cable 400 perpendicular to the orientation of the well body 113, which minimizes intrusion into the electrical enclosure 200. The RJ45 plug 401 is secured to the well body 113 with a separate latching component, plug retention clip 123 (see FIG. 9). The RJ45 plug 401 is not secured to the RJ45 jack assembly 150 as would be the case with a typical RJ45 assembly. Due to having the plug retention clip 123 on the well body 113 instead of the RJ45 jack assembly 150, the battery shuttle 114 can be partially withdrawn from the well body 113 while the RJ45 plug 401 stays fixed in place to the well body 113 (See FIG. 7). When the battery shuttle 114 is partially withdrawn, the RJ45 jack assembly 150 is disengaged from the RJ45 plug 401, making the display module 100 effectively electrically isolated from the DIN module 300 helping to eliminate any exposure to harmful electrical energy that could be derived from the DIN module 300. This is a key benefit of the invention described by this application as the RJ45 is a reliable and economical method of providing the eight separate conductors needed for the test and indication functionality while the sliding disconnect allows for a physical separation between the user-accessible components and the conductors that originate from circuitry that is in direct contact with dangerous levels of electrical energy.

Figure 7:
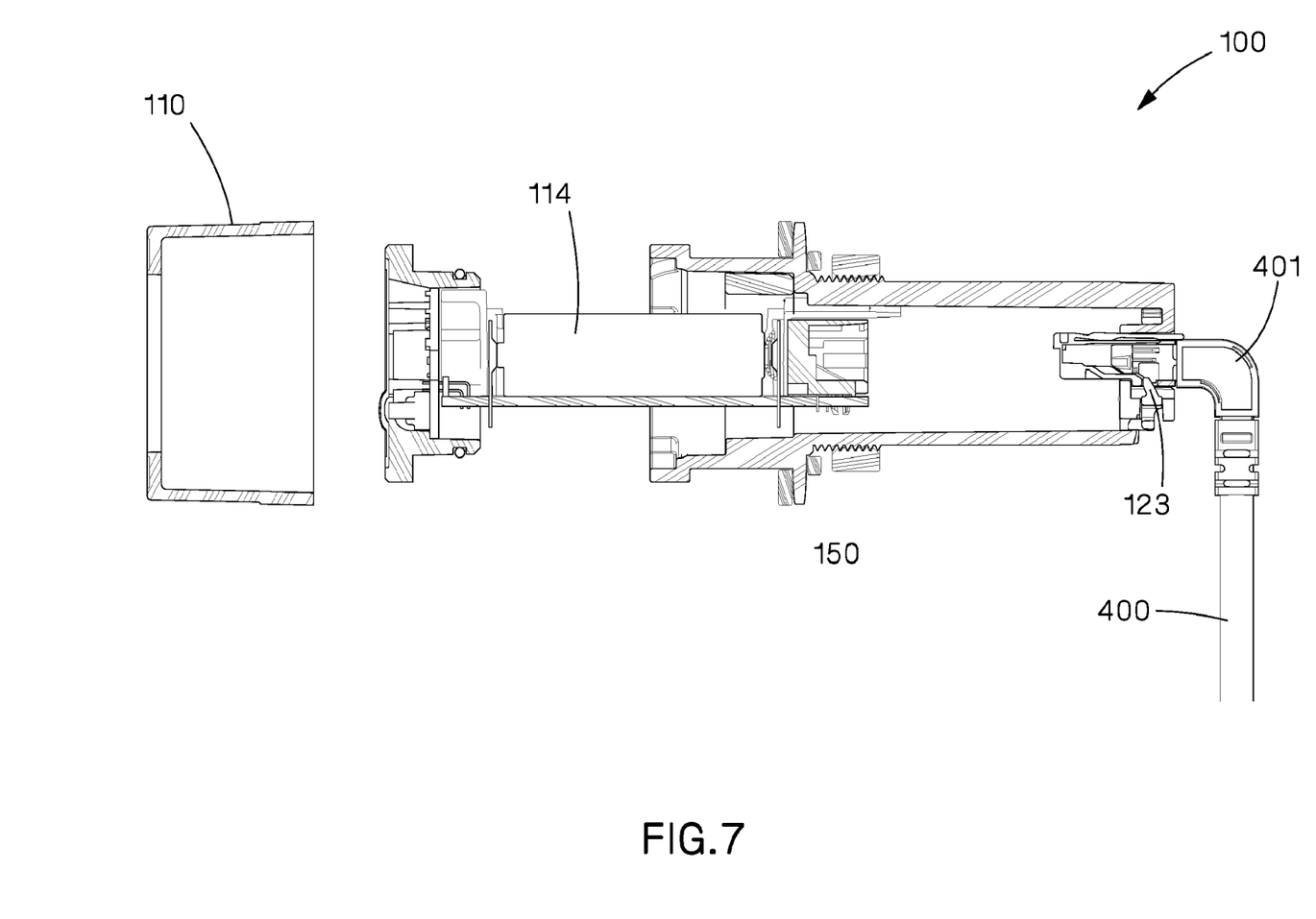
FIG. 7 is a cross-sectional view of the display module of FIG. 2 with the battery shuttle partially withdrawn.

FIG. 7 shows the battery shuttle 114 in the open position, and the resulting disconnection of the RJ45 jack assembly 150 from the RJ45 plug 401. The battery shuttle 114 travel is limited by interference features 124 built into the shuttle 114 and the battery shuttle retention ring 129 (see FIG. 8). The battery shuttle 114 can be removable from the well body 113 with tools when the user has access to the entire display module 100. However, generally speaking, the battery shuttle 114 is not intended to be removed from the well body 113 during normal operation. It is designed to extend enough for the user to access and remove the battery.

Figure 9:
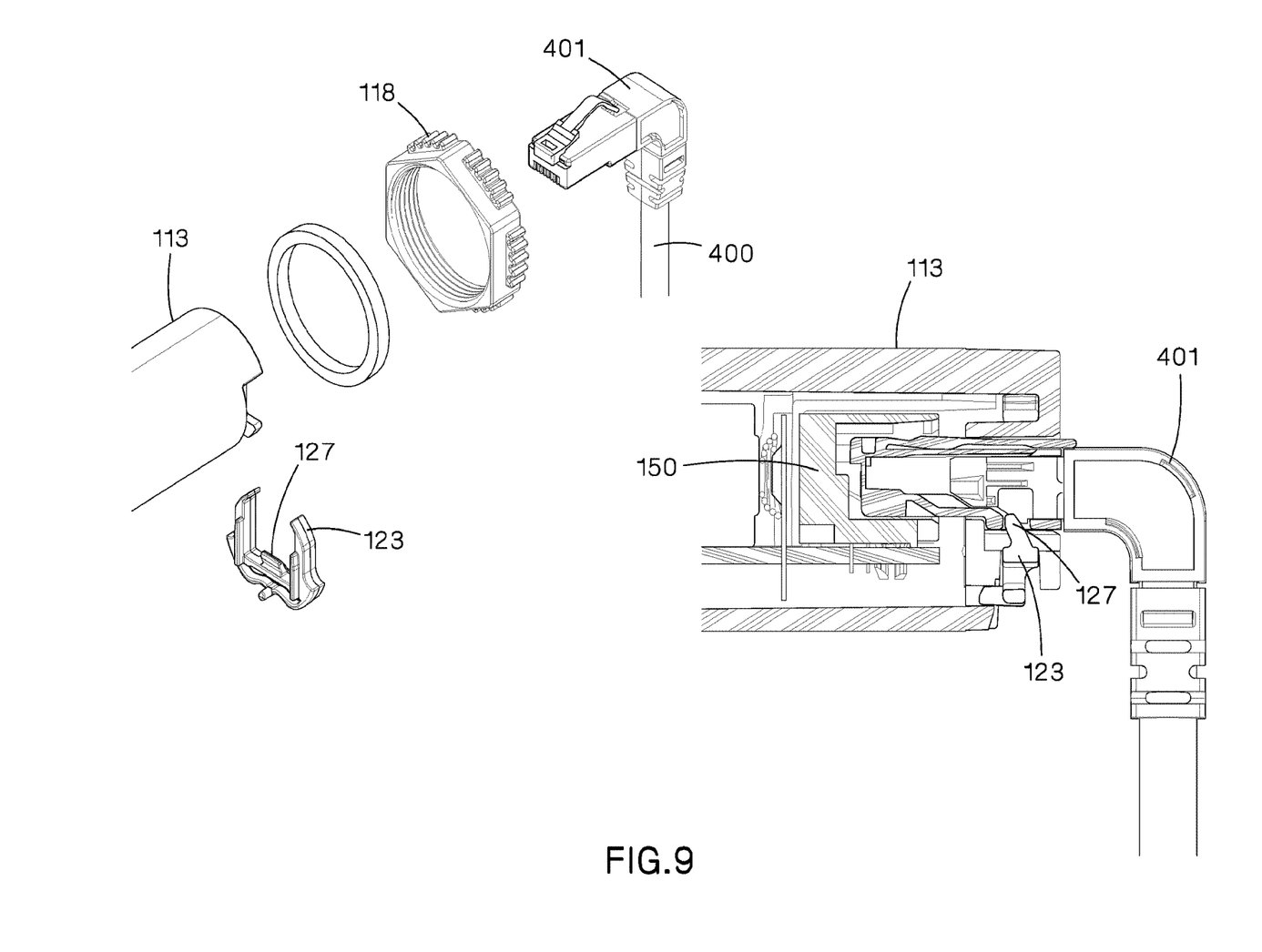
FIG. 9 is an isometric and cross-sectional view of the display module of FIG. 2, highlighting the plug retention clip.
Figure 10:
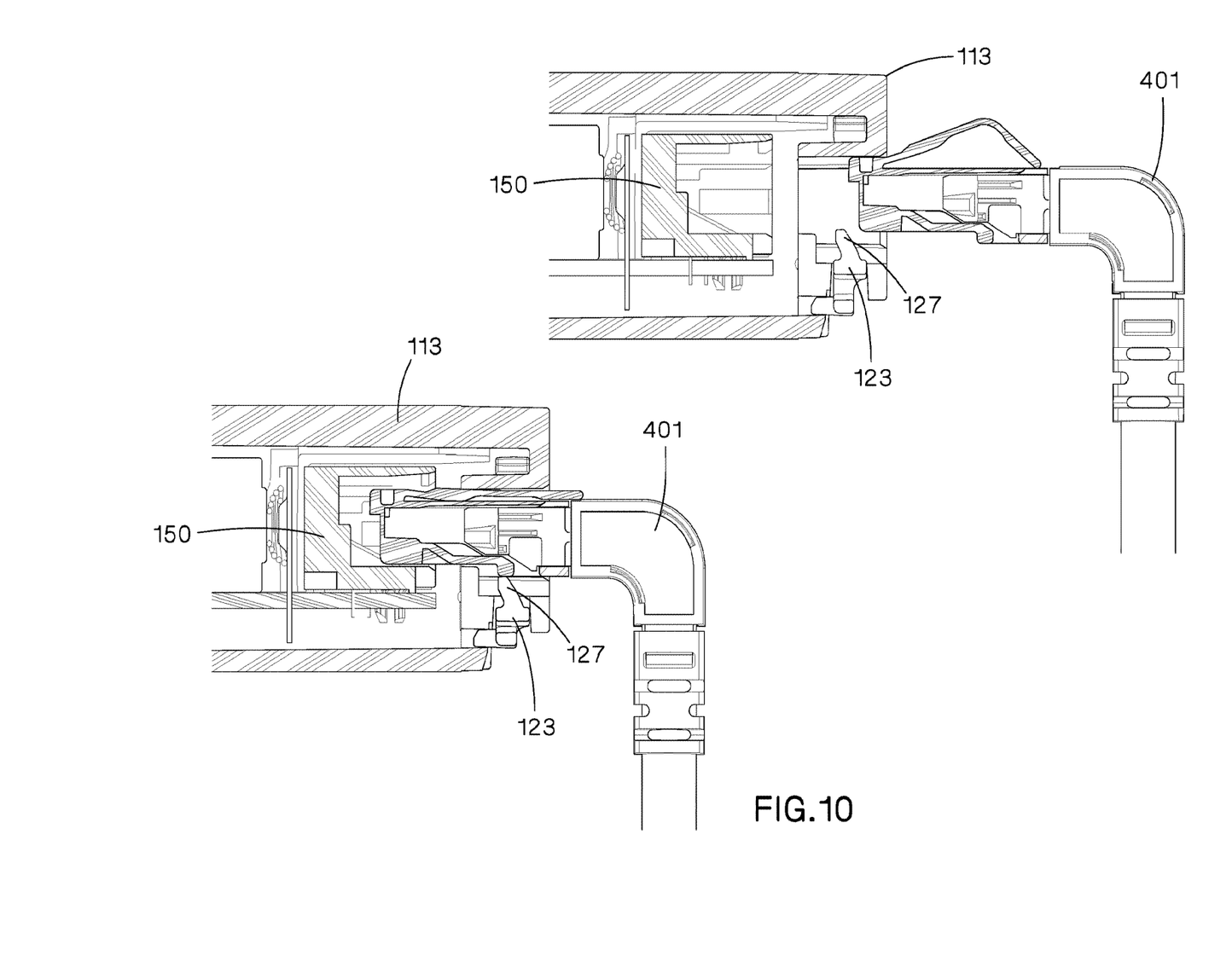
FIG. 10 is cross-sectional views of the display module of FIG. 2 highlighting the plug retention clip.

The plug retention clip 123 is a component that is secured to the well body 113 and holds the RJ45 plug 401 in a fixed position to the well body 113. This is accomplished with a plug retention catch 127 that engages an opening in the RJ45 plug 401. The latching component 123 is designed so it can be flexed to withdraw the latching component catch 127 and allow the RJ45 plug 401 to be removed from the well body 113. This allows a user to remove the RJ45 plug 401 and replace the RJ45 cable 400.

Figure 11:
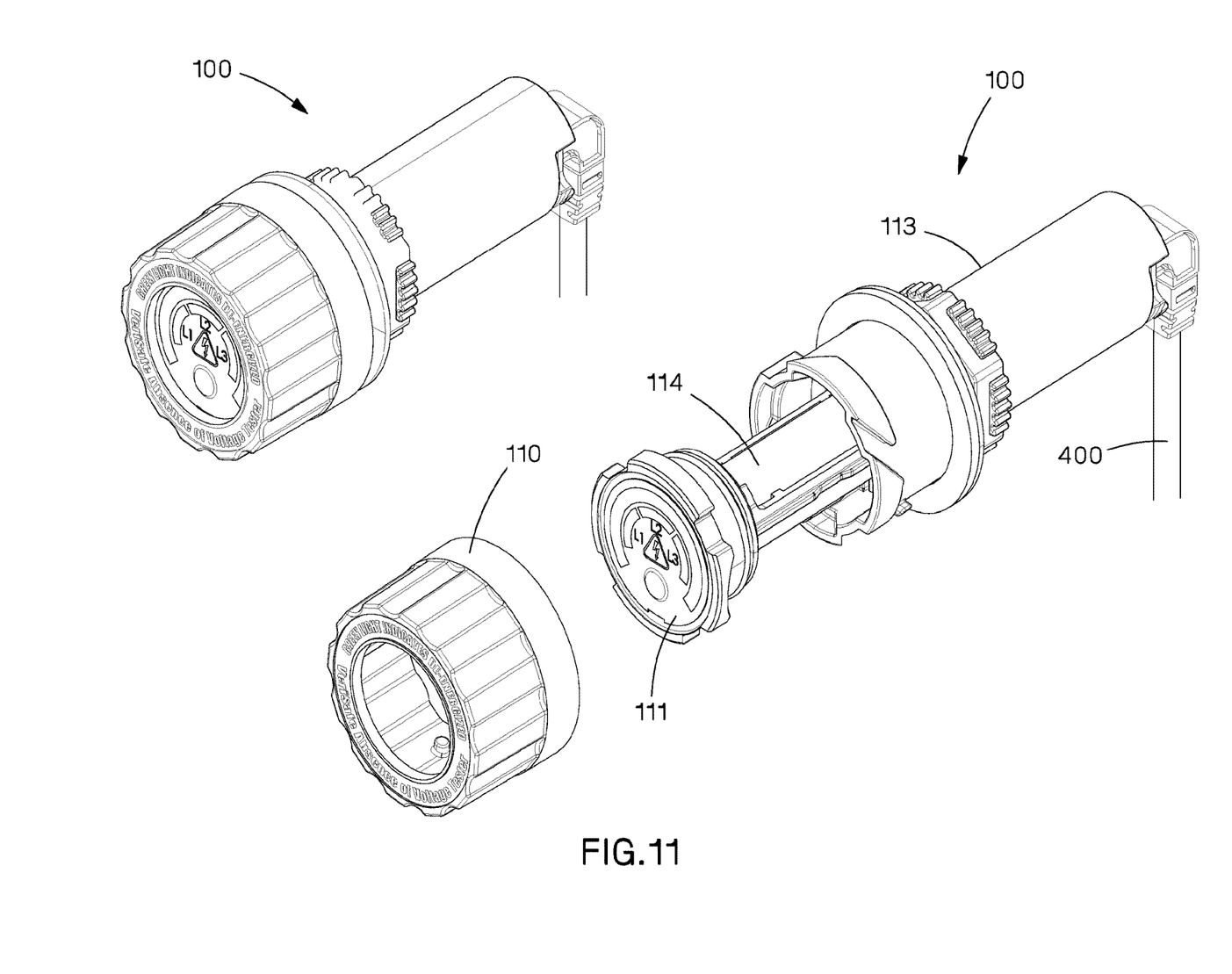
FIG. 11 is perspective views of the display module of FIG. 2 demonstrating the partial withdrawal of the battery shuttle.
Figure 12:
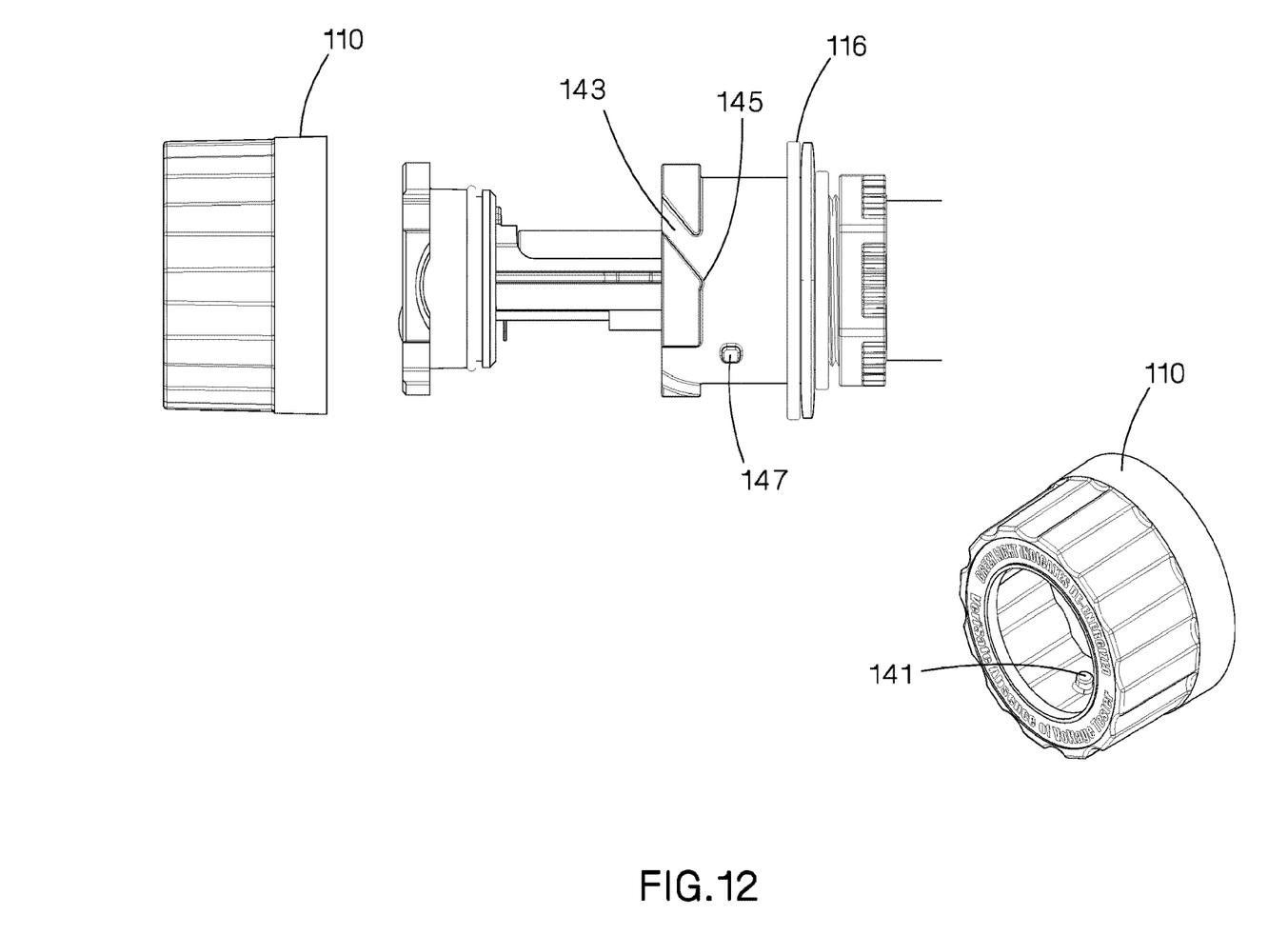
FIG. 12 is a side view and perspective view showing how the cap is secured to the well body.

As shown in FIGS. 11 and 12, the cap 110 retains the battery shuttle 114 in the fully inserted position and therefore keeps the RJ45 jack assembly 150 fully engaged and connected to the RJ45 plug 401. The cap 110 is installed by aligning the cap engagement boss 141 in the well body ramped cap engagement slot 143 and rotating the cap 110 to draw it in towards the compression washer 116. The compression washer 116 provides a spring type resistance to the cap 110, increasing the torque required to move over the well body cap retention bump 145. The well body cap retention bump 150 along with the compression washer 116 serves as resistance to rotating the cap 110 in the counter-clockwise direction for removal. The well body cap rotation limit boss 147 limits the rotation of the cap 110.

Figure 13:
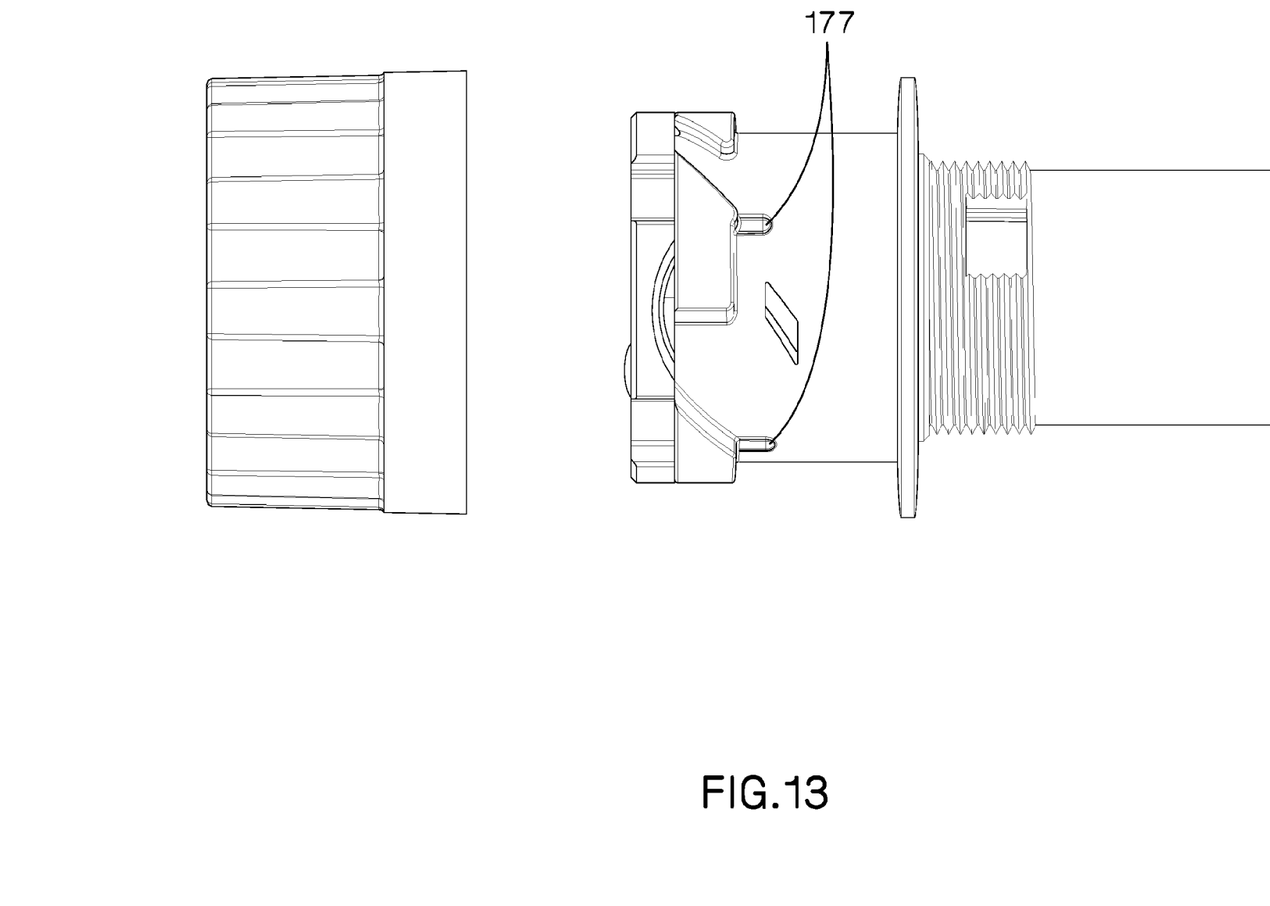
FIG. 13 is a side view showing an additional method of securing the cap to the well body.

FIG. 13 shows and alternate design for cap retention. In this design, the well body 113 has a series of cap retention tabs 177. When the user twists the cap 110 onto the well body 113, the cap engagement bosses 141 interfere with the cap retention tabs 177 and the cap will flex for the cap engagement bosses 141 to ride over the cap retention tabs 177. In order to remove the cap, the cap engagement bosses 141 will have to ride back over the cap retention tabs 177. This interference fit increases the torque required to remove the cap 110, which will hold it securely in place.

While particular embodiments and applications of the present invention have been illustrated and described, it is to be understood that the invention is not limited to the precise construction and compositions disclosed herein and that various modifications, changes, and variations may be apparent from the foregoing without departing from the spirit and scope of the invention as described.

What is claimed is:

1. A voltage display module for a voltage indication device for mounting to a door of an electrical enclosure comprising:
    a well body secured to the door of the electrical enclosure wherein a portion of the well body is contained within the enclosure;
    a communication cable with a communication plug, the communication plug being secured to the well body;
    a removable cap secured to the well body, the cap being accessible by a user from outside the electrical enclosure;
    a battery shuttle housed within the well body, the battery shuttle having a communication jack secured to it, the communication jack configured to engage the communication plug when the battery shuttle is fully inserted into the well body, the well body and communication jack being further configured to electrically isolate the communication jack from the communication plug when the battery shuttle is at least partially withdrawn from the well body and before the battery shuttle is fully withdrawn from the well body.

2. The voltage display module of claim 1 wherein the battery shuttle and well body contain retention feature preventing the complete removal of the battery shuttle from the well body.

3. The voltage display module of claim 1 wherein the communication plug is secured to the well body via a retention clip.

4. The voltage display module of claim 1 wherein the communication jack is an RJ45 style jack.

5. The voltage display module of claim 4 wherein the communication plug is an RJ45 style plug.

6. The voltage display module of claim 1 wherein the cap must be removed before the battery shuttle may be partially withdrawn.

7. The voltage display module of claim 1 wherein the battery shuttle further comprises electronics, the electronics being electrically isolated from the communication plug when the battery shuttle is partially withdrawn from the well body.

* * * * *